United States Patent [19]

Kyriakos

[11] Patent Number: 4,729,083

[45] Date of Patent: Mar. 1, 1988

[54] D.C. POWER SUPPLY WITH IMPROVED TRANSPARENCY TO POWER INTERRUPTS

[75] Inventor: Constantinos S. Kyriakos, Deerfield, Fla.

[73] Assignee: Allied-Signal Inc., Morristown, N.J.

[21] Appl. No.: 908,441

[22] Filed: Sep. 17, 1986

[51] Int. Cl.$^4$ .............................................. H02H 7/125
[52] U.S. Cl. ........................................ 363/53; 363/89; 307/46; 307/66
[58] Field of Search ...................... 363/53, 54, 84, 89, 363/126; 307/66, 46, 48; 361/92

[56] References Cited

U.S. PATENT DOCUMENTS

| | | | |
|---|---|---|---|
| 3,609,386 | 9/1971 | Patlach | 307/66 |
| 3,819,980 | 6/1974 | Mullersman | 307/66 X |
| 4,238,690 | 12/1980 | Clarke | 307/66 X |
| 4,323,960 | 4/1982 | Jones | 363/89 X |
| 4,327,298 | 4/1982 | Burgin | 307/66 |
| 4,354,118 | 10/1982 | Spencer | 307/66 |
| 4,471,423 | 9/1984 | Hase | 363/126 X |

Primary Examiner—Patrick R. Salce
Assistant Examiner—Kristine L. Peckman
Attorney, Agent, or Firm—B. L. Lamb; R. M. Trepp

[57] ABSTRACT

A d.c. power supply for computer logic circuits which is sensitive to brief interruptions in a.c. source power. The power supply includes an input transformer providing first and second a.c. voltages which are rectified to first and second d.c. voltage, the second d.c. voltage being of greater magnitude than the first d.c. voltage. A linear voltage regulator receives the first d.c. voltage as normal input and provides a third d.c. voltage of lesser magnitude than the first d.c. voltage. A storage capacitor is charged by the second d.c. voltage. A differential amplifier detects an interruption in source power and causes the storage capacitor to be connected to the input of the regulator whereby the regulator output is maintained during a brief interruption in source power by the discharge current of the storage capacitor.

2 Claims, 1 Drawing Figure

D.C. POWER SUPPLY WITH IMPROVED TRANSPARENCY TO POWER INTERRUPTS

The present invention relates to an improved regulated power supply for computer logic circuits. More particularly, it relates to a power supply having improved transparency to brief interruptions in the power source.

Computer systems used aboard aircraft are subject to brief interruptions in the power source much more frequently than are computer systems supplied with power from utility mains. It is desirable that the power supply for computer logic circuits, especially in aircraft, continue to supply regulated voltage output during brief interruptions in the power source to prevent the generation of data errors which may not be detected by the operator or which may require reformulation of the data by the operator. A power supply which continues to function at rated output during interruption of the power source is said to be "transparent" to power interrupts.

Usually, the power interrupts aboard aircraft which are of concern here are of the order of tens of milliseconds duration. The interrupt may take the form of a complete disappearance of source voltage or a reduction of source voltage below the level at which regulation of the power supply output voltage can be maintained. Sustained power inerrupts are not of concern here as they will ordinarily result in transfer of the computer memory circuits to battery power, shut down of computer logic operations and generation of a power interrupt signal.

Typically, a power supply for computer logic comprises a step-down transformer which receives primary input from a 110 V. a.c. source and which supplies 12 V. a.c. to a rectifier-filter. The d.c. output of the filter is reduced from 12 V. to 5 V. regulated usually by a linear type voltage regulator, although switching type regulators are also encountered.

Heretofore, transparency to short duration power interrupts has been provided in such power supplies either by employing a filter capacitor having a much greater capacity than is needed for effective filtering of the rectifier output or, if moderate filter capacity is used, by increasing the rectifier voltage to the maximum level at which the regulator can safely operate. The regulator will maintain constant output voltage for rated load current for an input voltage range of from 30 V. d.c. to 7 V. d.c. In either of the above cases the power supply will be insensitive to interruptions in the source voltage for the time required for the filter capacitor to discharge from the normal voltage level at the regulator input, i.e. 12 V. or 30 V., to the minimum input level of 7 V.

The disadvantages of these arrangements are, with the lower input voltage arrangement, a very large filter capacity is required, and with the higher input voltage arrangement, the regulator must continuously dissipate a relatively large amount of power in dropping the input voltage from 30 V. to 5 V.

It is an object of the invention to provide a power supply for computer logic circuits which is insensitive to interruptions in source power of the order of 100 milliseconds duration.

It is another object of the invention to provide a low voltage d.c. power supply which is insensitive to relatively short duration interruptions in source power and which does not require excessively large storage capacitors.

It is a further object of the invention to provide a low voltage d.c. power supply which is transparent to relatively short duration interruptions in source power and which does not dissipate excessive power during normal operation.

BRIEF DESCRIPTION

Briefly, the invention comprises a d.c. power supply having an input transformer which receives power from a 110 V. a.c. source. The transformer provides outputs of 12 V. a.c. and 36 V. a.c. The 12 V. a.c. output of the transformer is rectified, filtered and then regulated to 5. V. d.c. by a linear-type voltage regulator. The 36 V. a.c. output of the transformer is rectified for charging a storage capacitor. The storage capacitor is connected to the input of the 5 V. regulator through a normally open electronic switch. The switch is controlled by a detector which senses an interruption of power from the a.c. source to cause the switch to conduct and input to the 5 V. regulator is then provided by discharge current from the storage capacitor. The discharge time for the storage capacitor is increased by charging the capacitor to a higher voltage than the maximum allowable input voltage of the 5 V. regulator and by providing means for controlling the electronic switch so that the switch also serves as a pre-regulator for limiting the input voltage to the regulator to the allowable maximum value.

DESCRIPTION OF THE DRAWING

The single FIGURE of the drawing is a schematic diagram of the power supply of the invention.

DETAILED DESCRIPTION

Figure 1:
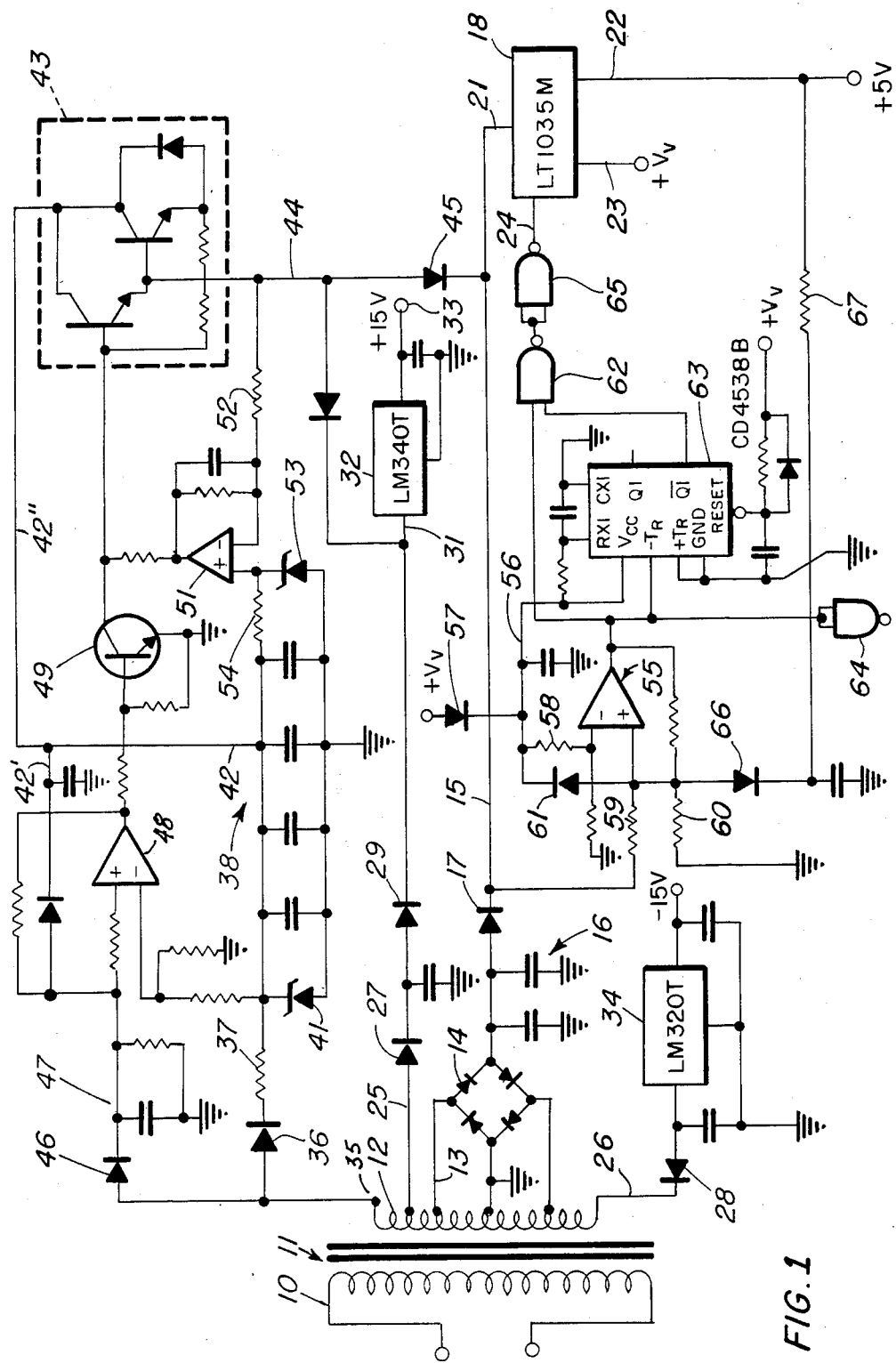

Referring to the drawing, power from a 110 V. a.c. source is supplied to the primary winding 10 of a transformer 11. The transformer secondary winding 12 is provided with multiple taps furnishing a.c. at various voltage levels to individual rectifiers for several substantially independent supplies of d.c. outputs at different voltages.

Center tapped portion 13 of winding 12 feeds a full wave rectifier bridge 14 producing an output at 12 V. d.c. on line 15. Filter capacitors 16, connected between line 15 and ground, reduce the ripple content of the output of bridge 14. A diode 17 inserted in line 15 prevents reverse flow of current into capacitor 16 if an interruption of power from the 110 V. source occurs. Following diode 17, line 15 leads to the input of a linear type voltage regulator 18.

Regulator 18 may suitably comprise a commercially available integrated circuit type LT1035M, a product of Linear Technology Corp., Malpitas, Calif. This type regulator is capable of regulating input voltage on terminal 21 ranging from 20 V. to 7 V. to a constant 5 V. output on terminal 22 at loads up to 3 a. An auxiliary regulated output at 5 V., 75 ma. is also provided at terminal 23. Regulator 18 further includes a shut down control by a logic signal on terminal 24, as will later be described.

Additional d.c. outputs are derived from taps 25 and 26 of the transformer secondary winding through a positively poled half wave diode rectifier 27 and a negatively poled half wave diode rectifier 28. The cathode of diode 27 is connected through an isolating diode 29 to the input terminal 31 of a linear type positive voltage regulator 32, suitably type LM340T, which regulates the output on terminal 33 to a constant +15 V. d.c., 100 ma. The anode of diode 28 is connected to the input terminal of a linear type negative voltage regulator 34, suitably type LM320T, which regulates the output to a constant −15 V. d.c., 100 ma. Regulator types LM340T and LM320T are both products of National Semiconductor Corporation, Santa Clara, Calif.

As thus far described, the power supply is entirely conventional in construction. The object of the invention is to provide a power supply insensitive to interruptions in source power of the order of tens of milliseconds duration. Particularly, the 5 V. d.c. output at regulator terminal 22 is to remain constant for rated loads of 1.5 a. during source power interruptions of up to 100 ms. duration. Conventionally, the capacity of filter capacitors of filter capacitors 16 could be increased to a sufficient value to provide approximately 100 ms. time for the capacitors to discharge from 12 V. to 7 V., the minimum voltage at which regulator 18 will maintain a constant 5 V. output. However, with a load current 1.5 a., the capacity necessary to provide such a discharge time is approximately 25,000 mf.

Tap 35 of transformer secondary 12 delivers a.c. to half wave diode rectifier 36 for conversion to 36 V. d.c. The cathode of diode 36 is connected through a current limiting resistor 37 to parallel connected storage capacitors 38. Capacitors 38 may suitably have total capacity of 4000 mf. Capacitors 38 are protected against overcharging by a 39 V. zener diode 41. Capacitors 38, when fully charged, supply 36 V. d.c. to lines 42, 42' and 42". Line 42" supplies a normally non-conductive Darlington amplifier 43 which functions primarily as an electronic switch. The output of amplifier 43 is connected by line 44 through an isolating diode 45 to line 15 and thence to input terminal 21 of regulator 18.

Interruptions in source power are sensed by a positively poled diode rectifier 46 connected to transformer tap 35 and feeding a short time constant RC filter 47. Normally, the voltage or the output of filter 47 is equal to the voltage across storage capacitors 38. These two voltages are compared in a comparator 48 which produces a near zero level output when the output of filter 47 and the voltage across capacitors 38 are substantially equal. When source power is interrupted, the output voltage of filter 47 falls rapidly below the voltage across capacitors 38. The output of comparator 48 then switches to a high positive level.

Transistor 49 is normally biased non-conductive by a low level output from comparator 48. Upon interruption of source power the high level output from comparator 48 biases transistor 49 conductive which, in turn, biases amplifier 43 conductive. The input bias to amplifier 43 is modulated by the operational amplifier 51 to regulate the voltage on line 44 to a maximum value of 20 V. Zener diode 53, connected through resistor 54 across storage capacitors 38, provides a reference voltage of 20 V. at the non-inverting input of amplifier 51 so long as the voltage across capacitors 38 exceeds 20 V. During this time, if the voltage on line 44, applied to the inverting input of amplifier 51 through resistor 52, tends to vary from 20 V., the output of amplifier 51 varies the input bias to amplifier 43 to maintain the voltage on line 44 constant at 20 V. When the voltage across capacitors 38 falls below 20 V., the voltage on line 44 becomes substantially equal thereto.

Certain logic devices are subject to being incapacitated by a condition known popularly as "lock-up" if the power supply voltage is permitted to drop below normal then return to normal without an intervening zero voltage interval. The circuit next to be described provides a zero voltage interval at output terminal 22 of regulator 18 whenever the output voltage of regulator 18 drops below 5 V.

A comparator 55 receives, on line 56, the auxiliary 5 V. output from terminal 23 of regulator 18 through an isolating diode 57. The voltage on line 56 is divided to approximately 4 V. by a voltage divider 58 and applied to the inverting input of comparator 55 as a reference voltage. The input voltage to regulator 18, from line 15, is divided approximately in half by a voltage divider comprising resistors 59 and 60. The voltage at the junction of resistors 59 and 60, limited to 5 V. max. by clamping diode 61, is applied to the non-inverting input of comparator 55. So long as the voltage on line 15 is 8 V. or higher, the output of comparator 55 is at a high level.

The output of comparator 55 provides one input to a NAND gate 62, an input to the trailing edge trigger input of a monostable multivibrator 63 and a power interrupt signal through a NAND gate 64. The complimentary output of multivibrator 63 provides a second input to NAND gate 62. With a high level output from comparator 55, the complimentary output of multivibrator 63 is high and the output of gate 62 is low. The output of gate 62 is inverted in gate 65 to appear as a high level at the logic input terminal 24 of regulator 18. When the signal at terminal 24 is low level, the output of regulator 18 at terminal 2 is shut down. The output at terminal 23 is not interrupted when a low level signal appears on terminal 24.

When the voltage on line 15 drops below 8 V., the output of comparator 55 switches to a low level. This transition triggers multivibrator 63 causing the complimentary output thereof to drop low for approximately 100 ms. Both inputs to gate 62 are then low, resulting in a low level signal on terminal 24 of regulator 18 and shut down of the ouput on terminal 22. Diode 66, connected through resistor 67 between the non-inverting input of comparator 55 and the 5 V. output line from regulator terminal 22, stabilizes the comparator by preventing a voltage rise at the comparator input terminal when load is removed from line 15 by shut down of the output from terminal 22. Multivibrator 63 may comprise type CD4538B, a product of RCA Corp., Princeton, N.J.

The invention claimed is:

1. A d.c. power supply having improved insensitivity to brief interruptions of source power comprising
   an a.c. power source;
   a transformer receiving power from said a.c. source; and providing at least first and second a.c. output voltages, said second a.c. output voltage being of greater magnitude than said first a.c. output voltage;
   first means for rectifying said first a.c. output voltage to provide a first d.c. voltage;
   second means for rectifying said second a.c. output voltage to provide a second d.c. voltage, said second d.c. voltage being of greater magnitude than said first d.c. voltage;
   regulating means having an input terminal and normally receiving said first d.c. voltage at said input terminal and providing a third regulated d.c. output voltage, said third d.c. voltage being of lesser magnitude than said first d.c. voltage;

a storage capacitor normally fully charged by said second d.c. voltage;

normally non-conductive switch means for connecting said storage capacitor as an input to said regulating means, said switch means including:

a transistor amplifier receiving input from said storage capacitor and providing output to said input terminal of said regulating means; and sensing means for detecting an interruption of power from said a.c. source and for controlling said switch means, said sensing means causing said switch means to conduct upon detecting of interruption of power from said source to thereby provide input to said regulating means from said storage capacitor, said sensing means comprising:

means for comparing voltage from said a.c. source with voltage from said storage capacitor for providing an output bias voltage, said bias voltage being applied to said amplifier for controlling the conduction of said amplifier, said bias voltage rendering said amplifier non-conductive so long as the voltage from said a.c. source applied to said comparing means is greater than the voltage applied thereto from said storage capacitor; and a first source of reference voltage;

means receiving said amplifier output and said reference voltage for varying said bias voltage applied to said amplifier whereby conduction of said amplifier is controlled so that said amplifier output does not exceed reference voltage.

2. A d.c. power supply as claimed in claim 1 wherein said regulating means includes a control input for shutting down the output thereof upon the application of a particular logic signal to said control input, and with additionally, a second source of reference voltage having a value substantially equal to the minimum value of input voltage to said regulating means at which said regulating means can maintain regulation; and means comparing the voltage at said regulating means input terminal with said second reference voltage for generating said particular logic signal to cause the shut down of said regulating means whenever the voltage at said input terminal drops below said reference voltage.

* * * * *